(12) United States Patent
Wong et al.

(10) Patent No.: US 7,746,150 B2
(45) Date of Patent: Jun. 29, 2010

(54) CIRCUIT AND METHOD FOR PROVIDING A FAIL-SAFE DIFFERENTIAL RECEIVER

(75) Inventors: Thomas S. Wong, San Jose, CA (US); Uwe Biswurm, Frankfurt (DE); Bernd Neumann, Muellrose (DE)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 11/493,253

(22) Filed: Jul. 25, 2006

(65) Prior Publication Data

US 2008/0024174 A1 Jan. 31, 2008

(51) Int. Cl.
*G06F 7/6433* (2006.01)

(52) U.S. Cl. .................. 327/335; 327/336; 327/65; 327/58; 327/62

(58) Field of Classification Search ............... None
See application file for complete search history.

(56) References Cited

U.S. PATENT DOCUMENTS

| | | | |
|---|---|---|---|
| 4,141,494 A * | 2/1979 | Fisher | 235/449 |
| 4,401,901 A * | 8/1983 | Ochi | 327/89 |
| 5,510,734 A * | 4/1996 | Sone | 327/65 |
| 5,541,538 A * | 7/1996 | Bacrania et al. | 327/77 |
| 5,880,615 A * | 3/1999 | Bazes | 327/307 |
| 5,925,868 A * | 7/1999 | Arends et al. | 235/454 |
| 6,047,894 A * | 4/2000 | Arends et al. | 235/462.22 |
| 6,288,577 B1 | 9/2001 | Wong | |
| 6,628,145 B1 * | 9/2003 | Sudjian | 326/115 |
| 6,650,149 B1 | 11/2003 | Wong | |
| 6,879,198 B2 | 4/2005 | Kumar et al. | |
| 2006/0152626 A1 * | 7/2006 | Heijna | 348/532 |

* cited by examiner

*Primary Examiner*—Tuan Lam
*Assistant Examiner*—Hiep Nguyen
(74) *Attorney, Agent, or Firm*—Dorsey & Whitney LLP

(57) ABSTRACT

A fail-safe differential receiver having a differential amplifier adapted to receive first and second differential input signals and generate a differential voltage. A peak detector is coupled to the differential amplifier for generating a detect signal and a comparator is coupled to the peak detector for comparing the detect signal to a threshold voltage and providing a comparison signal. A directing circuit is coupled to the differential amplifier for receiving the first and second differential input signals and is coupled to the comparator for receiving the comparison signal. An output amplifier is coupled to the directing circuit. The directing circuit selectively directs the first and second differential input signals to the output amplifier as a function of the value of the comparison signal from the comparator.

33 Claims, 8 Drawing Sheets

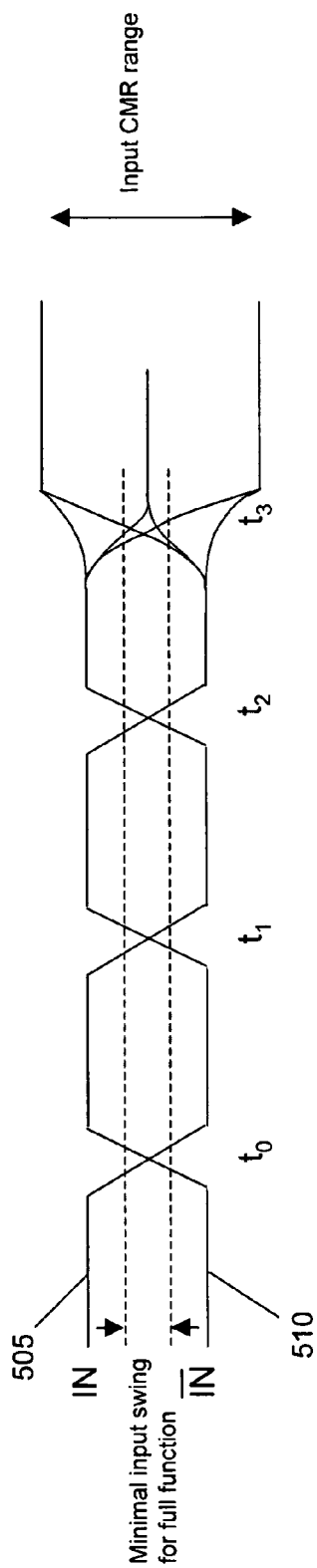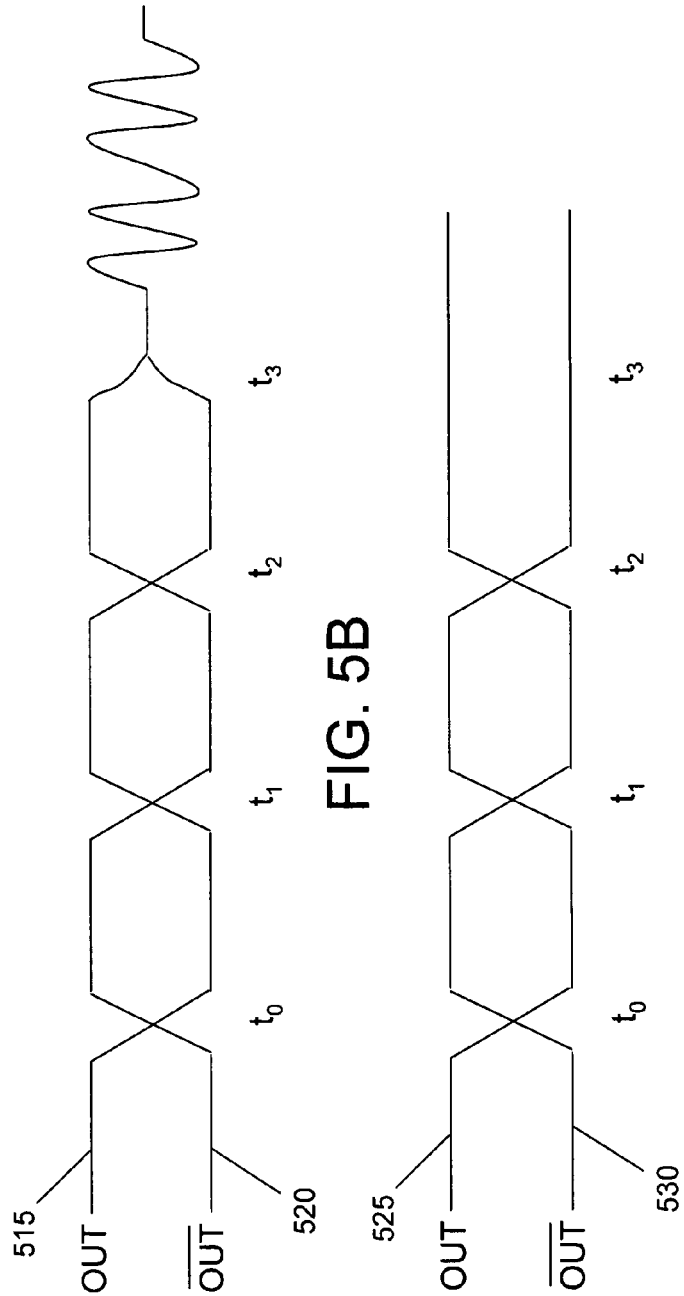
FIG. 5A
FIG. 5B
FIG. 5C

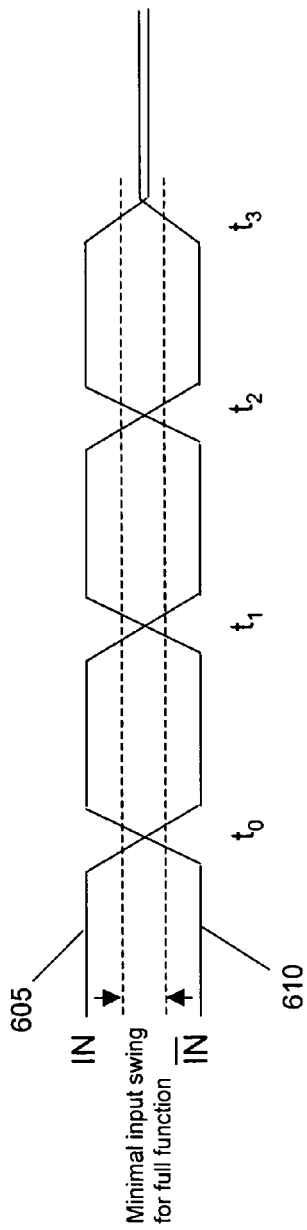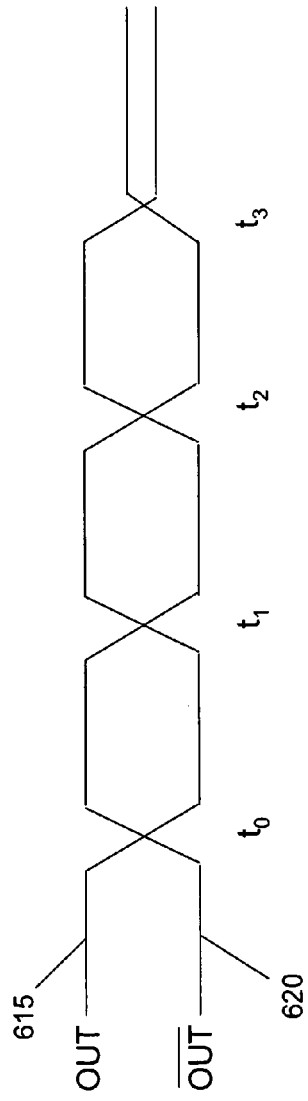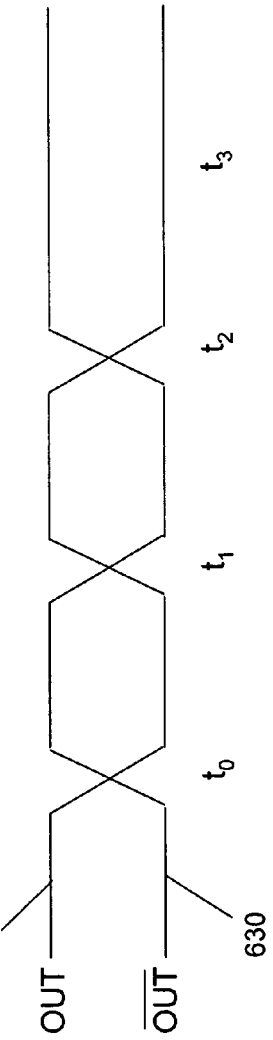

CIRCUIT AND METHOD FOR PROVIDING A FAIL-SAFE DIFFERENTIAL RECEIVER

FIELD OF THE INVENTION

The present invention relates generally to differential receivers, and more particularly to fail-safe differential receivers.

BACKGROUND INFORMATION

Differential receivers have been provided to protect a pair of differential inputs from interference and noise degradation that occur when the differential inputs are transmitted over a transmission line. See, for example, U.S. Pat. Nos. 6,288,577, 6,650,149 and 6,879,198.

Typical differential receivers may be able to tolerate certain types of fault and degradation in the differential inputs. For example, they may be able to tolerate "stuck at" signal faults, which occur when the differential inputs remain at their logical levels and don't switch to subsequent logical levels. Typical differential receivers may not, however, be able to tolerate other types of signal faults such as "stuck at" faults with only one of the differential inputs stuck at a certain logic level, short and open faults as well as no signal faults. These faults generally cause both differential inputs to have equal or no differential voltage, thereby leading to an unpredictable output signal and behavior, including oscillations at the differential outputs.

For example, a typical prior-art differential receiver is shown in FIG. 1. Differential receiver 100 receives differential inputs 105 and 110 at opposite logical levels. Each differential input is coupled to a transistor, with differential input 105 coupled to the base of transistor 115 ("$Q_1$") and differential input 110 coupled to the base of transistor 120 ("$Q_2$"). Current source 125 ("$I_1$") is coupled to the emitters of transistors 115 and 120, and resistors 130 ("$R_1$") and 135 ("$R_2$") are in turn coupled to the collectors of transistors 115 and 120, respectively. The collectors of transistors 115 and 120 are also coupled to the bases of transistors 140 ("$Q_3$") and 145 ("$Q_4$"), respectively. The emitters of transistors 140 and 145 are respectively coupled to current sources 150 ("$I_{2a}$") and 155 ("$I_{2b}$"). The emitters of transistors 140 and 145 are in turn coupled to output amplifier 160, which generates differential outputs 165 and 170.

Differential receiver 100 operates as follows. When differential input 105 is at a logical level opposite than that of differential input 110 with sufficient voltage difference, the differential outputs 165 and 170 deliver full swing output. For example, when differential input 105 is high and differential input 110 is low, transistor 115 is turned ON and transistor 120 is turned OFF. The collector current of transistor 115 corresponding to the current in current source 125 flows through resistor 130 resulting in a voltage drop across resistor 130, which will provide a differential voltage at the bases of transistors 140 and 145. Transistors 140 and 145 are always ON and form voltage followers, that is, differential signals 180 and 185 "follow" differential signals at the bases of transistors 140 and 145 respectively. This way, differential receiver 100 delivers a full output swing when differential inputs 105 and 110 are behaving normally. However, in the case when differential inputs 105 and 110 are stuck at the same voltage level due to some "stuck at" fault conditions, that is, the base terminals of transistors 115 and 120 have the same voltage, both transistors 115 and 120 will be turned ON. As a result, differential outputs 165 and 170 may be in an undetermined state or even oscillating.

To prevent this unpredictable behavior at the output, prior art attempts have been made to include a Schmitt-Trigger in a differential receiver. A Schmitt-Trigger, as generally used herein, may act as a memory to retain the value of the differential inputs when they are at an undetermined state, e.g., between a high and low logic levels, until they change sufficiently to "trigger" a change in state. A Schmitt-Trigger has been used, for example in the prior-art differential receiver illustrated in FIG. 2. Differential receiver 200 receives differential inputs 205 and 210 and generates differential outputs 215 and 220. In addition to having the same configuration of differential receiver 100 shown in FIG. 1, that is, in addition to having transistors 115 and 120, current source 125, resistors 130 and 135, transistors 140 and 145, current sources 150 and 155, and output amplifier 160, differential receiver 200 has Schmitt-Trigger 225 formed by transistors 230 ("$Q_5$") and 235 ("$Q_6$") and current source 240 ("$I_{1b}$"). The bases of transistors 230 and 235 are connected to the collectors of transistors 115 and 120, respectively, and the collectors of transistors 230 and 235 are in turn respectively connected to the collectors of transistors 120 and 115, which are connected to the bases of transistors 145 and 140. Current source 240 is connected to the emitters of transistors 230 and 235.

Differential receiver 200 operates as follows. When differential input 205 is at a logical level opposite than that of differential input 210 with sufficient voltage difference, the differential outputs 215 and 220 deliver full swing output. For example, when differential input 205 is high and differential input 210 is low, transistor 115 is turned ON and transistor 120 is turned OFF. Current sources 125 and 240 and resistors 130 and 135 are configured such that transistor 235 is turned ON and transistor 230 is turned OFF.

The amount of hysteresis introduced by Schmitt-Trigger 225 can be programmed by current source 240, which is designed to ensure that one of transistors 230 and 235 is turned ON while the other is OFF when there is no voltage difference between inputs 205 and 210. This hysteresis would also reinforce the state of differential inputs 205 and 210 when there is sufficient voltage difference between inputs 205 and 210. Assuming right before a fault is developed, input 205 is high and input 210 is low, transistor 115 is turned ON resulting in a low voltage at the collector of transistor 115. When differential inputs 205 and 210 are stuck at the same voltage level for example, transistor 230 may try to turn itself ON from its OFF state, but it will be prevented from doing so because the collector of transistor 115 will be at a lower voltage than the collector of transistor 120.

This lower voltage will prevent current from current source 240 to flow to the collector of transistor 230. As a result, differential outputs 215 and 220 will retain their value and won't change to a different logic state until differential inputs 205 and 210 are at logic levels sufficient for turning transistor 230 ON, that is, at voltage levels sufficient for triggering a change in the logic states of differential outputs 215 and 220. Schmitt-Trigger 225 therefore prevents differential outputs 215 and 220 from oscillating or having an unpredictable behavior. When differential inputs 205 and 210 are behaving unexpectedly, differential outputs 215 and 220 may still behave appropriately and retain their logic values.

Although Schmitt-Trigger 225 prevents differential outputs 215 and 220 from behaving unpredictably, because it is in the data path between transistors 115 and 120 and transistors 140 and 145, it affects the bandwidth of the differential receiver 200 and causes waveform distortion. There is, therefore, a need to implement a fail-safe differential receiver that tolerates unpredictable behavior at the differential inputs without affecting its bandwidth or distorting the waveforms at the differential outputs.

SUMMARY OF THE INVENTION

The present invention provides a fail-safe differential receiver having a differential amplifier adapted to receive first and second differential input signals and generate first and second differential signals that are based on the first and second differential input signals and have a differential voltage. A peak detector is coupled to the differential amplifier for generating a detect signal and a comparator is coupled to the peak detector for comparing the detect signal to a threshold voltage and providing a comparison signal. A directing circuit is coupled to the differential amplifier for receiving the first and second differential input signals and is coupled to the comparator for receiving the comparison signal. The directing circuit selectively directs between the first and second differential signals and a predetermined signal as a function of the value of the comparison signal from the comparator.

BRIEF DESCRIPTION OF THE DRAWINGS

The accompanying drawings, which are somewhat schematic in some instances and are incorporated in and form a part of this specification, illustrate several embodiments of the invention and, together with the description, serve to explain the principles of the invention.

FIG. 5A shows an exemplary timing diagram of differential inputs experiencing a signal fault and arriving at the same voltage level;

FIG. 5B shows an exemplary timing diagram of differential outputs generated by a typical differential receiver such as that shown in FIG. 1 following receipt of the differential inputs shown in FIG. 5A;

FIG. 5C shows an exemplary timing diagram of differential outputs generated by the fail-safe receiver shown in FIG. 3A following receipt of the differential inputs shown in FIG. 5A;

FIG. 6A shows an exemplary timing diagram of differential inputs experiencing a signal fault and reducing their voltage levels;

FIG. 6B shows an exemplary timing diagram of differential outputs generated by a typical differential receiver such as that shown in FIG. 1 following receipt of the differential inputs shown in FIG. 6A; and FIG. 6C shows an exemplary timing diagram of differential outputs generated by the fail-safe receiver shown in FIG. 3A following receipt of the differential inputs shown in FIG. 6A.

DETAILED DESCRIPTION OF EMBODIMENTS OF THE INVENTION

Figure 3A:
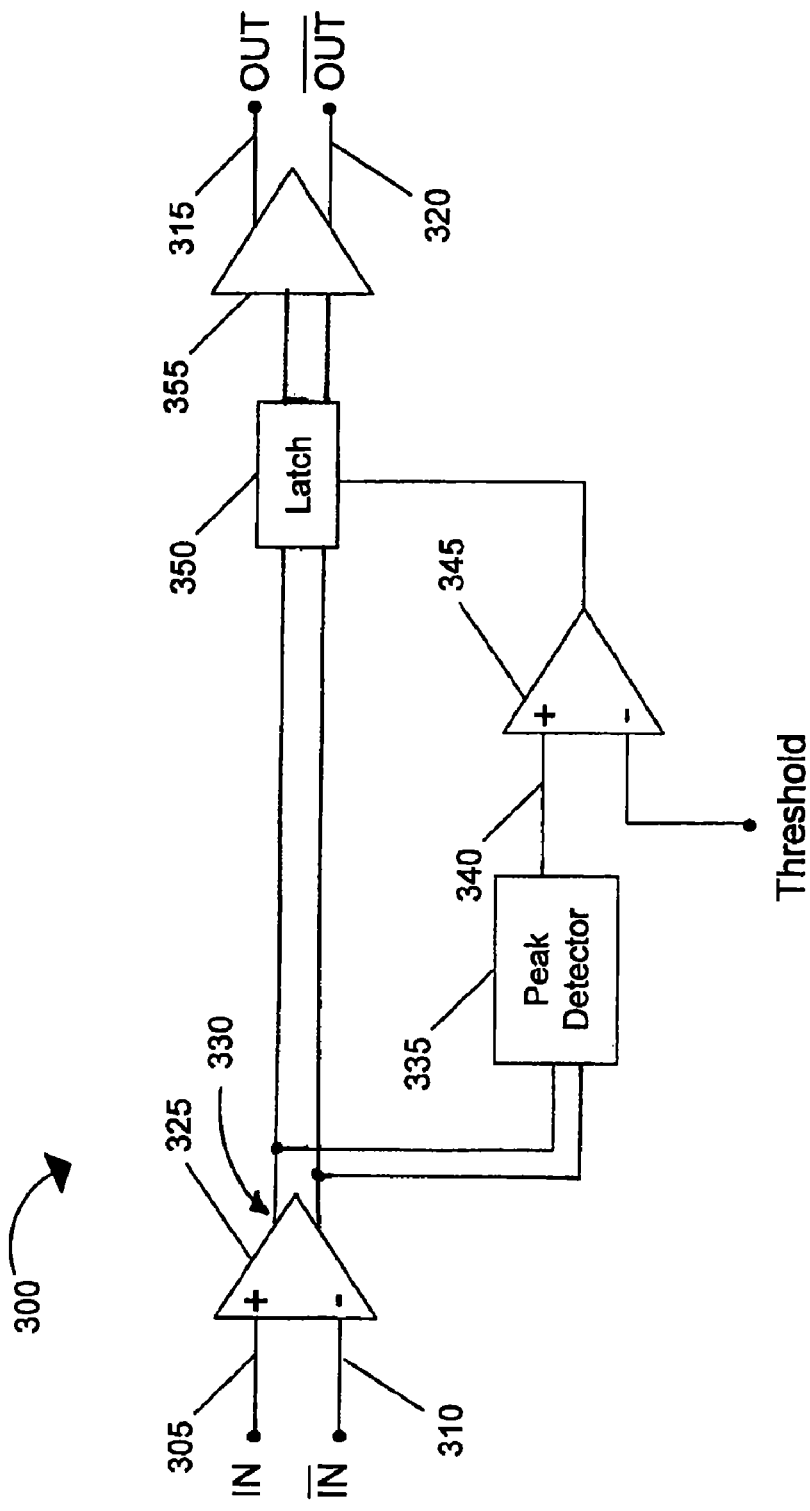
FIG. 3A shows a schematic diagram of an exemplary embodiment of a fail-safe receiver designed in accordance with the present invention.

A schematic diagram of an exemplary embodiment of a high-speed, fail-safe differential receiver designed in accordance with the present invention is provided in FIG. 3A. Fail-safe differential receiver 300 receives differential inputs 305 and 310 and generates differential outputs 315 and 320. Differential receiver 300 includes differential amplifier 325 for receiving differential inputs 305 and 310 and generating differential signals that have a differential voltage at its output 330, a peak detector 335 coupled to output 330 of differential amplifier 325 for generating a detect signal at its output 340, comparator 345 coupled to output 340 of peak detector 335 for comparing the detect signal to a threshold voltage, directing circuit 350 coupled to comparator 345 and output 330 of differential amplifier 325, and output amplifier 355 coupled to directing circuit 350 for generating differential outputs 315 and 320. A directing circuit, as generally referred to herein, may be a device or a combination of devices, e.g., a register, a latch, or a combination of logic gates, that selectively directs its inputs to its outputs as a function of a signal. In this exemplary embodiment, directing circuit 350 is a latch. In particular, the outputs of the latch follow its inputs when enabled, and the latch holds the last value of its inputs to provide to its outputs when disabled.

Fail-safe differential receiver 300 operates as follows. Peak detector 335 detects the signal level of the differential voltage generated at output 330 of differential amplifier 325 and generates a detect signal at its output 340. Comparator 345 compares the detect signal at output 340 of peak detector 335 to a preset threshold voltage. If the signal level is higher than the preset level, then latch 350 is enabled and differential outputs 315 and 320 follow differential inputs 305 and 310, i.e., the differential signals based on the differential inputs 305 and 310 are provided at differential outputs 315 and 320. That is, when differential inputs 305 and 310 are behaving expectedly, differential receiver 300 is in normal operation and generating predictable output behavior in the presence of differential inputs that are experiencing no signal faults.

If, however, differential inputs 305 and 310 experience a signal fault causing the signal level detected by peak detector 335 to be smaller than the preset threshold voltage, i.e., causing the detect signal at output 340 of peak detector 335 to be smaller than the preset threshold voltage, latch 350 is disabled and holds the differential signals, which are based on the last values of differential inputs 305 and 310, to provide the differential signals to differential outputs 315 and 320, i.e., differential outputs 315 and 320 will remain unchanged.

Figure 1:
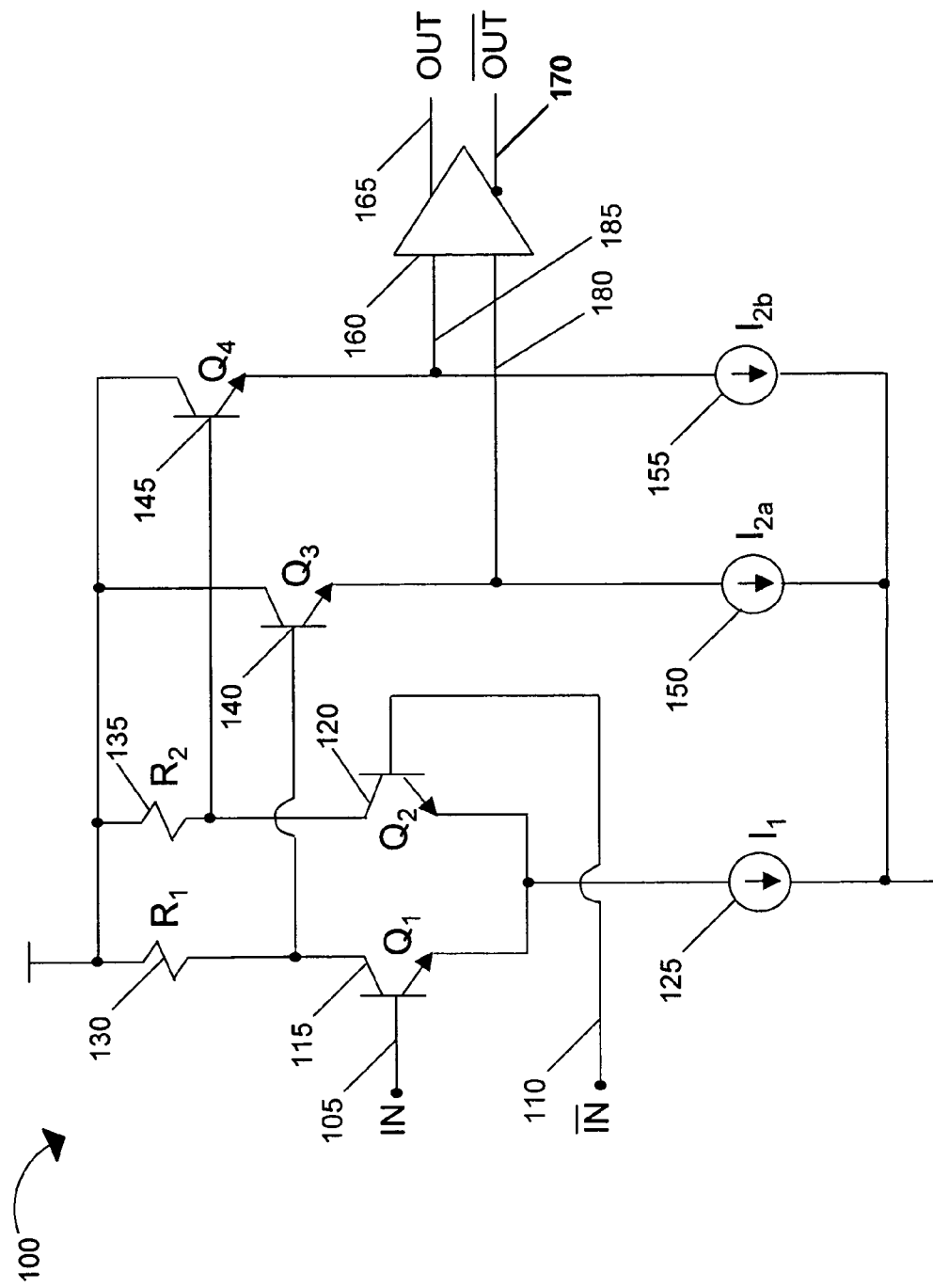
FIG. 1 shows an exemplary schematic diagram of a prior-art differential receiver.
Figure 2:
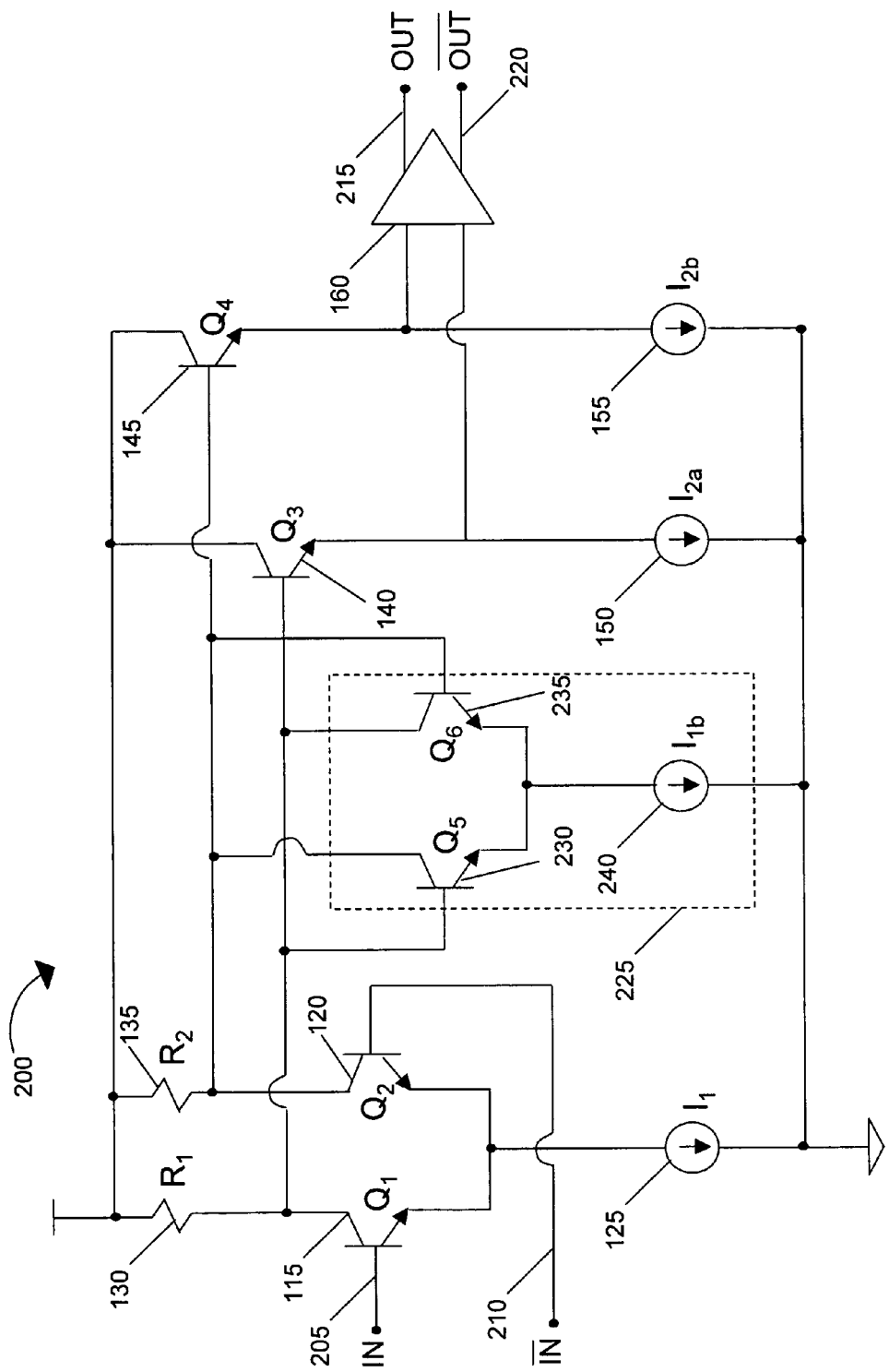
FIG. 2 shows an exemplary schematic diagram of a prior-art differential receiver with a Schmitt-Trigger.

That is, when differential inputs 305 and 310 experience a signal fault, differential outputs 315 and 320 may not oscillate or have an unpredictable behavior, but rather they remain at the same state immediately prior to the signal fault. Differential receiver 300, therefore, still produces a full output swing even in the presence of signal faults in the differential inputs. And because differential receiver 300 employs a latch instead of a traditional Schmitt-Trigger such as the one shown in FIG. 2, differential receiver 300 may be able to produce a full output swing without decreasing the bandwidth or distorting the waveforms at differential outputs 315 and 320.

Figure 3B:
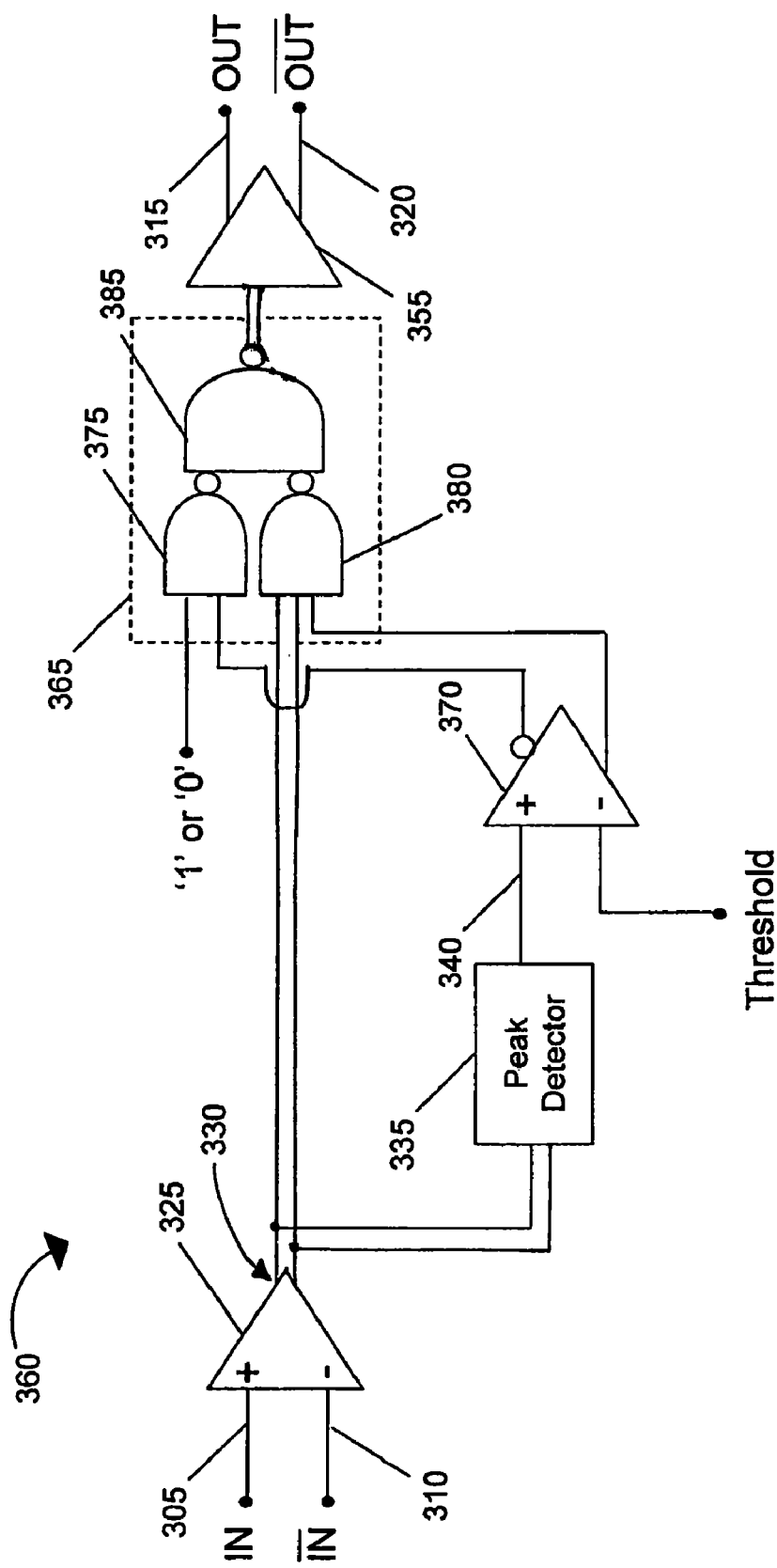
FIG. 3B shows a schematic diagram of another exemplary embodiment of a fail-safe receiver designed in accordance with the present invention.

In another exemplary embodiment, shown in FIG. 3B, directing circuit 350 is a combination of logic gates, such as, combination of NAND gates 375, 380, 385. Logic gates 375, 380, 385 may be used to generate either a high or low voltage level. That is, when differential inputs 305 and 310 experience a signal fault, differential output 315 will either be high or low, depending on design requirements for the receiver. A designer may choose to have the differential outputs at a high or low voltage level instead of holding the previous state immediately prior to the signal fault.

Figure 4A:
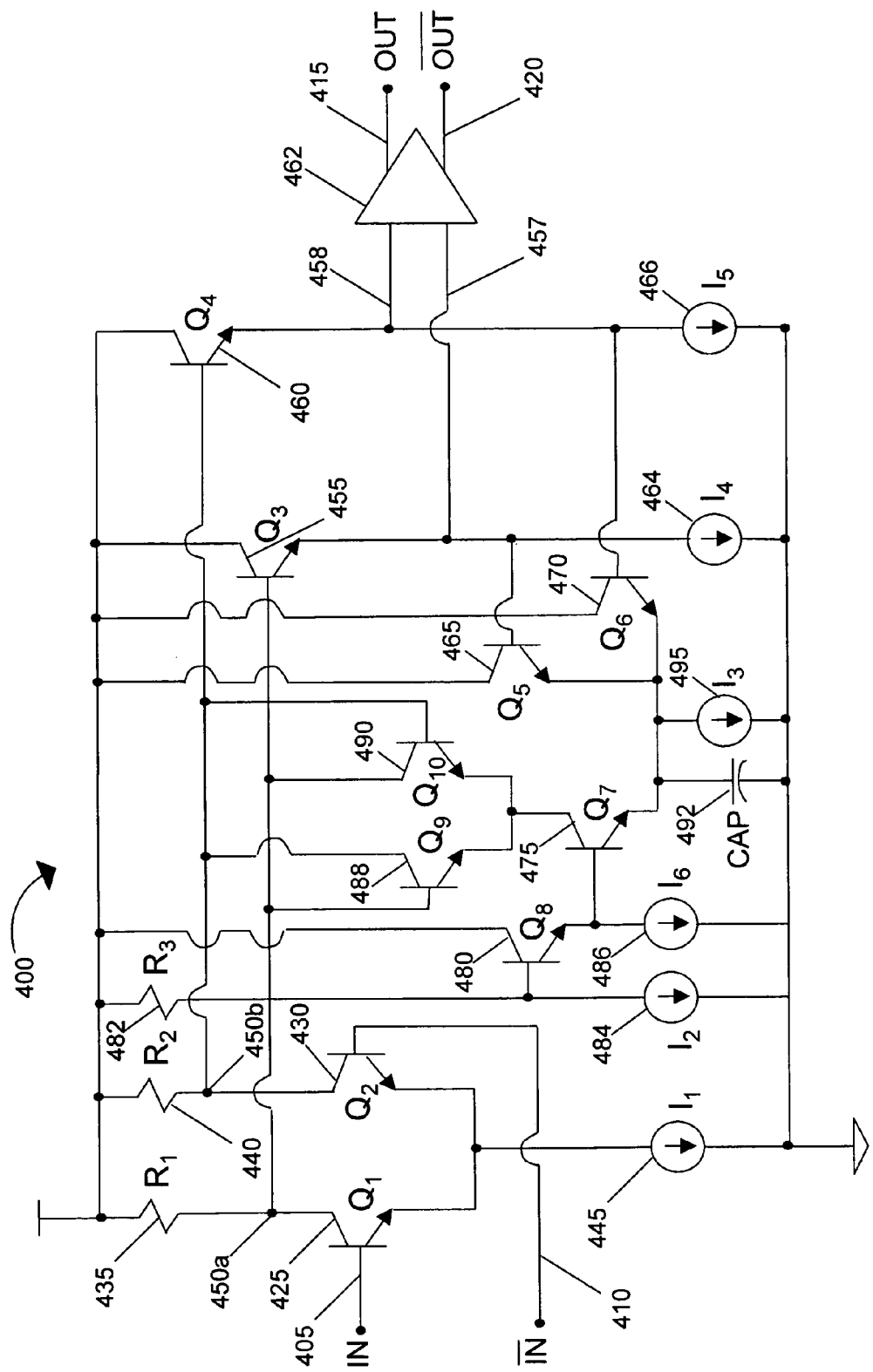
FIG. 4A shows an exemplary implementation of the fail-safe receiver shown in FIG. 3A.

The components of differential receiver 300 shown in FIG. 3A, e.g., differential amplifier 325, peak detector 335, comparator 345, and latch 350, may be implemented in numerous ways, such as the exemplary implementation shown in FIG. 4A. Differential receiver 400 receives differential inputs 405 and 410 and generates differential outputs 415 and 420. Differential amplifier 325 may be implemented with transistors 425 and 430, resistors 435 and 440, and current source 445. Each differential input is coupled to a transistor, with differential input 405 coupled to the base of transistor 425 ("$Q_1$") and differential input 410 coupled to the base of transistor 430 ("$Q_2$"). Current source 445 ("$I_1$") is coupled to the emitters of transistors 425 and 430, and resistors 435 ("$R_1$") and 440 ("$R_2$") are in turn coupled to the collectors of transistors 425 and 430, respectively.

Output 330 of differential amplifier 325 is provided at terminals 450a and 450b. Output terminals 450a and 450b are connected to the bases of transistor 455 ("$Q_3$") and transistor 460 ("$Q_4$"), respectively. Transistors 455 and 460 form voltage followers, that is, differential signals 457 and 458 "follow" differential signals at terminals 450a and 450b respectively, to provide DC offset of the differential signal 450a and 450b to the inputs of the output amplifier 462. The emitters of transistors 455 and 460 are also connected to current sources 464 and 466, respectively.

The emitters of transistors 455 and 460 are connected to peak detector 335. Peak detector 335 may be implemented with transistors 465 ("$Q_5$") and 470 ("$Q_6$") and capacitor 492. The collectors of transistors 455 and 460 are connected to the collectors of transistors 465 and 470 as well as to the power supply. The emitters of transistors 455 and 460 are respectively connected to the bases of transistors 465 and 470.

As shown in FIG. 3A, output 340 of peak detector 335 is connected to comparator 345. Comparator 345 may be implemented with transistor 475 ("$Q_7$") in combination with transistors 465 and 470. The emitter of transistor 475 is connected to the emitters of transistors 465 and 470. The base of transistor 475 is in turn connected to the emitter of transistor 480 ("$Q_8$") and current source 486 ("$I_6$"). The base of transistor 480 is connected to resistor 482 and current source 484. Resistor 482 and current source 484 in conjunction with transistor 480 and current source 486 form the preset threshold voltage shown in FIG. 3A that is input into comparator 345.

The output of comparator 345 is connected to latch 350. Latch 350 may be implemented with transistors 488 ("$Q_9$") and 490 ("$Q_{10}$"), in combination with transistors 465, 470, and 475 and current source 495. In particular the emitters of transistors 488 and 490 are connected to the collector of transistor 475. Latch 350 is also connected to differential amplifier 325 and output amplifier 355. This may be accomplished by connecting the base of transistor 488 and the collector of transistor 490 to output terminal 450a, i.e., to the collector of transistor 425, and to the base of transistor 455, and connecting the collector of transistor 488 and the base of transistor 490 to output terminal 450b, i.e., to the collector of transistor 430, and to the base of transistor 460.

Comparator 345 is also connected to capacitor 492 and current source 495. In particular, the emitters of transistors 465, 470 and 475 are connected to capacitor 492 and current source 495. Capacitor 492 may act as an integrator for peak detector 335 and provide a time delay between peak detector 335 and comparator 345. Capacitor 492 stabilizes the transient voltages in transistors 465 and 470 that are a part of peak detector 335.

Fail-safe differential receiver 400 operates as follows. Differential inputs 405 and 410 are at opposite logical levels, for example, differential input 405 is high and differential input 410 is low. When differential input 405 is high, transistor 425 is turned ON and when differential input 410 is low, transistor 430 is turned OFF. A voltage follower is also present in differential receiver 400, and in this case, is formed by transistors 455 and 460, which are always turned ON.

As described above, peak detector 335 is formed with transistors 465 and 470 and capacitor 492. The detect signal generated by peak detector 335 is then passed on to comparator 345, implemented with transistor 475 in combination with transistors 465 and 470. As shown in FIG. 3A, comparator 345 compares the detect signal generated by peak detector 335 with the preset threshold voltage formed by resistor 482, current source 484, transistor 480 and current source 486.

If the detect signal is higher than the threshold voltage, i.e., if the base voltage of transistor 475 is lower than the base voltage of either transistor 465 or 470, transistor 475 is turned OFF. With transistor 475 OFF, latch 350 formed by transistors 488 and 490 in combination with transistors 465, 470, and 475 and current source 495 will be enabled. Transistors 488 and 490 will be both turned OFF, resulting in differential inputs 405 and 410 to flow into differential outputs 415 and 420 via the voltage follower formed by transistor 455 and 460 and output amplifier 462.

If the detect signal is lower than the threshold voltage, i.e., if the base voltage of transistor 475 is higher than base voltages of both transistors 465 and 470, transistor 475 is turned ON. With transistor 475 ON, latch 350 formed by transistors 488 and 490 in combination with transistors 465, 470, and 475 and current source 495 will be disabled. In this case, either transistors 488 or transistor 490 will be turned ON to preserve or hold the previous output state of differential receiver 400.

Because latch 350 is not in the data path when it is enabled, it would not decrease the bandwidth of the differential receiver 400 or distort the waveforms at differential outputs 415 and 420.

Figure 4B:
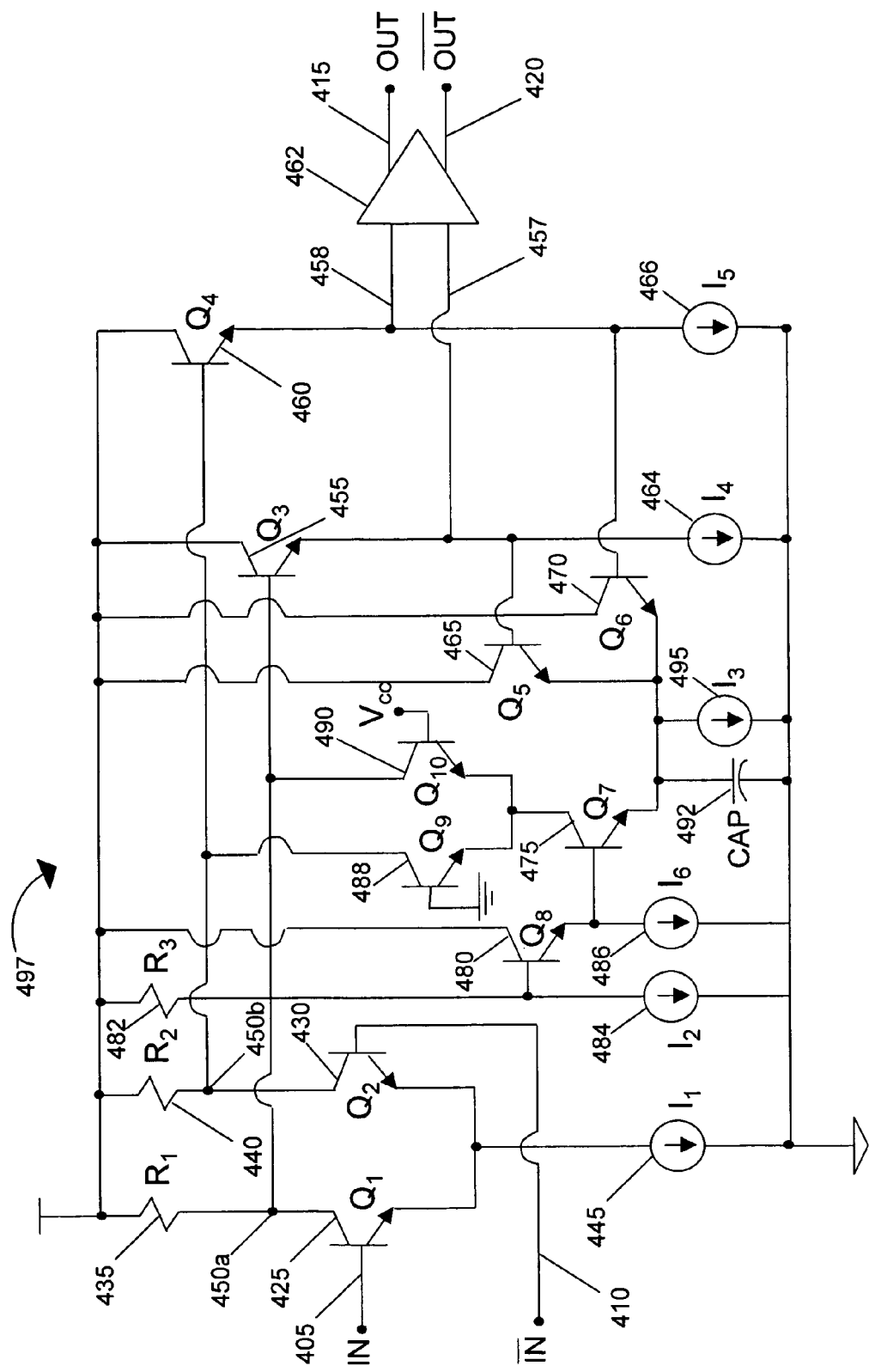
FIG. 4B shows an exemplary implementation of the fail-safe receiver shown in FIG. 3B.

In another exemplary embodiment, the components of differential receiver 360 shown in FIG. 3B, may also be implemented in numerous ways, such as the exemplary implementation shown in FIG. 4B. Differential receiver 497 has the same components as differential receiver 400 shown in FIG. 4A, with the difference being in the way the directing circuit is implemented. In this example, instead of latching the previous state of the differential signals, which are based on the differential inputs 405 and 410 prior to a signal fault, directing circuit 365 is implemented to generate either a "1" or a "0," that is, to generate either a high or low voltage level.

This is done by connecting the bases of transistors 488 and 490 to either a high or low voltage as a predetermined signal instead of connecting them back to the collectors of transistors 490 and 488, respectively. To generate a "1" as the predetermined signal as shown in the implementation shown in FIG. 4B, the base of transistor 488 receives a low voltage, such as by connecting it to ground, and the base of transistor 490 receives a high voltage, such as by connecting it to the power supply. Alternatively, to generate a "0" as the predetermined signal, the reverse configuration may be implemented, that is, the base of transistor 488 receives a high voltage and the base of transistor 490 receives a low voltage.

It should be understood by one of ordinary skill in the art that the connections to ground and power supply for transistors 488 and 490 to receive a low or a high voltage as described above are shown for exemplary and illustration purposes only. Other configurations for generating the low and high voltage levels for the transistors may be implemented without deviating from the scope and principles of the present invention.

The behavior of differential receiver 400 may be better understood by timing diagrams of differential inputs and outputs in the presence of signal faults at the differential inputs. FIG. 5A shows differential inputs 505 and 510 experiencing a signal fault at time t3 so that their behavior is unpredictable. As shown, the signals may start to collapse unexpectedly and the differential inputs 505 and 510 end up at the same voltage level. With prior art differential receivers, such as differential receiver 200 shown in FIG. 2, differential inputs 505 and 510 may result in differential outputs 515 and 520 shown in FIG. 5B. At time t3, differential outputs 515 and 520 may be at same voltage level, which could cause oscillation somewhere in the system, or start to oscillate unexpectedly. In contrast, fail-safe differential receiver 300 shown in FIG. 3A, which may be implemented as fail-safe differential receiver 400 shown in FIG. 4, is able to produce a full output swing at differential outputs 525 and 530 even in the presence of the signal fault experienced by differential inputs 505 and 510 at time t3 and eliminate the possibility of oscillation.

Similarly, FIG. 6A also shows differential inputs 605 and 610 experiencing a signal fault at time t3 so that their behavior is unpredictable. As shown, the signals have a reduced voltage level. With prior art differential receivers, such as differential receiver 200 shown in FIG. 2, differential inputs 605 and 610 may result in differential outputs 615 and 620 shown in FIG. 6B. At time t3, differential outputs 615 and 620 also have a reduced voltage level. In contrast, fail-safe differential receiver 300 shown in FIG. 3A, which may be implemented as fail-safe differential receiver 400 shown in FIG. 4, is able to produce a full output swing at differential outputs 625 and 630 even in the presence of the signal fault experienced by differential inputs 605 and 610 at time t3.

As can be seen from the foregoing, a new fail-safe differential receiver has been provided that tolerates unpredictable behavior at the differential inputs without affecting its bandwidth or distorting the waveforms at the differential outputs. The new fail-safe differential receiver provides stable performance with a simple design, delivering a full output swing regardless of the input signal fault.

The foregoing descriptions of specific embodiments and best mode of the present invention have been presented for purposes of illustration and description only. They are not intended to be exhaustive or to limit the invention to the precise forms disclosed. Specific features of the invention are shown in some drawings and not in others, for purposes of convenience only, and any feature may be combined with other features in accordance with the invention. Steps of the described processes may be reordered or combined, and other steps may be included. The embodiments were chosen and described in order to best explain the principles of the invention and its practical application, to thereby enable others skilled in the art to best utilize the invention and various embodiments with various modifications as are suited to the particular use contemplated. Further variations of the invention will be apparent to one skilled in the art in light of this disclosure and such variations are intended to fall within the scope of the appended claims and their equivalents.

What is claimed is:

1. A fail-safe differential receiver circuit for use with a first differential input signal and a second differential input signal and at least one predetermined signal and a threshold voltage, the circuit comprising a differential amplifier configured to receive the first and second differential input signals, the differential amplifier generating first and second differential signals that are based on the first and second differential input signals and have a differential voltage, a peak detector coupled to the differential amplifier for generating a detect signal, a comparator coupled to the peak detector for comparing the detect signal to the threshold voltage and providing a comparison signal, and a directing circuit coupled to the differential amplifier for receiving the generated first and second differential signals and coupled to the comparator for receiving the comparison signal, the directing circuit selectively directing between the generated first and second differential signals and the at least one predetermined signal as a function of the value of the comparison signal from the comparator.

2. The fail-safe differential receiver circuit of claim 1, wherein the differential amplifier comprises a first transistor for receiving the first differential input signal and a second transistor for receiving the second differential input signal.

3. The fail-safe differential receiver circuit of claim 2, further comprising a first current source coupled to the first and second transistors.

4. The fail-safe differential receiver circuit of claim 3, further comprising a second current source and a resistor coupled to the second current source for providing the threshold voltage.

5. The fail-safe differential receiver circuit of claim 4, further comprising a third transistor coupled to the resistor and the second current source.

6. The fail-safe differential receiver circuit of claim 5, wherein the peak detector includes a fourth transistor coupled to the first transistor and a fifth transistor coupled to the second transistor.

7. The fail-safe differential receiver of claim 6, further comprising a third current source coupled to the fourth and fifth transistors.

8. The fail-safe differential receiver circuit of claim 7, wherein the comparator includes a sixth transistor coupled to the third, fourth, and fifth transistors.

9. The fail-safe differential receiver of claim 8, wherein the directing circuit includes a latch.

10. The fail-safe differential receiver circuit of claim 9, wherein the latch includes a seventh transistor and an eighth transistor coupled to the sixth transistor.

11. The fail-safe differential receiver circuit of claim 10, further comprising a ninth transistor and a tenth transistor coupled to the seventh and the eighth transistors.

12. The fail-safe differential receiver circuit of claim 11, wherein the ninth transistor is coupled to the first transistor and the tenth transistor is coupled to the second transistor.

13. The fail-safe differential receiver circuit of claim 12, wherein the ninth and tenth transistors are coupled to an output of the circuit.

14. The fail-safe differential receiver circuit of claim 1, wherein the peak detector includes an integrating capacitor.

15. The fail-safe differential receiver circuit of claim 9 for use with first and second earlier differential signals, wherein the latch includes a memory for retaining the first and second earlier differential signals and wherein the latch directs the first and second differential signals when the comparison signal is a first value and retains the first and second earlier differential signals as the at least one predetermined signal when the comparison signal is a second value.

16. The fail-safe differential receiver of claim 1, wherein the directing circuit comprises a combination of logic gates for directing a high or low voltage signal as the at least one predetermined signal when the comparison signal is a second value.

17. A fail-safe differential receiver circuit for use with a first differential input signal and a second differential input signal and at least one predetermined signal and a threshold voltage, the circuit comprising a first transistor coupled to the first differential input signal and a second transistor coupled to the second differential input signal for generating first and second differential signals that are based on the first and second differential input signals and have a differential voltage, a resistor coupled to a first current source for setting a threshold voltage, a third transistor coupled to the resistor and the first current source, a comparator coupled to the first, second, and third transistors for comparing the differential voltage to the threshold voltage and generating a comparison signal, and a fourth transistor and a fifth transistor coupled to the comparator for forming a directing circuit, the directing circuit selectively directing between the first and second differential signals and the at least one predetermined signal as a function of the value of the comparison signal from the comparator.

18. The fail-safe differential receiver circuit of claim 17, further comprising a peak detector coupled to the first and second transistors.

19. The fail-safe differential receiver circuit of claim 18, wherein the peak detector includes a sixth transistor coupled to the first transistor and a seventh transistor coupled to the second transistor.

20. The fail-safe differential receiver circuit of claim 19, wherein the comparator includes an eighth transistor coupled to the sixth and seventh transistors.

21. The fail-safe differential receiver circuit of claim 17, wherein the fourth and fifth transistors are coupled to a ninth transistor and a tenth transistor.

22. The fail-safe differential receiver circuit of claim 21, wherein the ninth transistor is coupled to the first transistor and the tenth transistor is coupled to the second transistor.

23. The fail-safe differential receiver of claim 22, wherein the ninth and tenth transistors are coupled to an output of the receiver.

24. The fail-safe differential receiver of claim 18, wherein the peak detector further includes an integrating capacitor.

25. The fail-safe differential receiver of claim 17, wherein the directing circuit comprises a latch.

26. The fail-safe differential receiver of claim 17, wherein the directing circuit comprises a combination of logic gates for directing a high or low voltage signal as the at least one predetermined signal when the comparison signal indicates that the differential voltage is lower than the threshold voltage.

27. A method for providing a fail-safe differential receiver, the method comprising generating a peak voltage signal amplitude from first and second differential signals that are based on a first differential input signal and a second differential input signal, comparing the peak voltage signal amplitude to a threshold voltage to generate a comparison signal and providing the comparison signal to a directing circuit, the directing circuit selectively directing between the first and second differential signals and at least one predetermined signal as a function of the comparison signal.

28. The method of claim 27, further comprising generating the threshold voltage with a resistor coupled to a current source.

29. The method of claim 27, further comprising determining the peak voltage signal amplitude with a peak detector.

30. The method of claim 28, wherein comparing the peak voltage signal amplitude to the threshold voltage includes using a comparator coupled to the peak detector.

31. The method of claim 27, wherein selectively directing includes enabling the directing circuit with the comparison signal when the generated peak voltage signal amplitude is higher than the threshold voltage.

32. The method of claim 27, wherein selectively directing includes disabling the directing circuit with the comparison signal when the generated peak voltage signal amplitude is smaller than the threshold voltage.

33. The method of claim 27, wherein the comparison signal is provided to a combination of logic gates for directing a high or low voltage signal as the at least one predetermined signal when the comparison signal indicates that the generated peak voltage signal amplitude is lower than the threshold voltage.

* * * * *